United States Patent
Norton et al.

(10) Patent No.: US 6,900,411 B2
(45) Date of Patent: May 31, 2005

(54) FLEXIBLE HEATER FOR HEATING ELECTRICAL COMPONENTS IN OPERATOR CONTROL HANDLE

(75) Inventors: David G. Norton, Port Crane, NY (US); Jeffrey J. Kuss, Binghamton, NY (US)

(73) Assignee: The Raymond Corporation, Greene, NY (US)

( * ) Notice: Subject to any disclaimer, the term of this patent is extended or adjusted under 35 U.S.C. 154(b) by 0 days.

(21) Appl. No.: 10/360,703

(22) Filed: Feb. 6, 2003

(65) Prior Publication Data

US 2004/0155021 A1 Aug. 12, 2004

(51) Int. Cl.[7] .............................................. H05B 1/00
(52) U.S. Cl. ..................................... 219/209; 219/202
(58) Field of Search ................................ 219/202, 209, 219/497, 543, 549

(56) References Cited

U.S. PATENT DOCUMENTS

| | | | | |
|---|---|---|---|---|
| 3,289,046 A | * | 11/1966 | Carr ............................ 361/772 |
| 3,939,666 A | * | 2/1976 | Bashark ........................ 62/150 |
| 4,352,008 A | * | 9/1982 | Hofer et al. ................. 219/540 |
| 4,374,316 A | * | 2/1983 | Inamori et al. .............. 219/209 |
| 4,404,813 A | * | 9/1983 | Paddock et al. .............. 62/127 |
| 4,440,421 A | | 4/1984 | Adamson |
| 4,557,225 A | * | 12/1985 | Sagues et al. ............ 123/41.31 |
| 4,631,976 A | | 12/1986 | Noda et al. |
| 4,654,970 A | | 4/1987 | Nagashima |
| 4,684,783 A | * | 8/1987 | Gore .......................... 219/210 |
| 5,105,067 A | * | 4/1992 | Brekkestran et al. ....... 219/497 |
| 5,268,558 A | * | 12/1993 | Youssef et al. ............. 219/209 |
| 5,574,627 A | * | 11/1996 | Porter ........................ 361/719 |
| 5,585,024 A | * | 12/1996 | Kosugi ....................... 219/494 |
| 5,613,407 A | | 3/1997 | Ogata |
| 5,626,780 A | | 5/1997 | Ogata |
| 5,735,037 A | | 4/1998 | Ogata |
| 5,834,734 A | | 11/1998 | Ogata |
| 5,898,992 A | | 5/1999 | Annable |
| 5,994,679 A | * | 11/1999 | DeVeau et al. ............. 219/530 |
| 6,114,668 A | | 9/2000 | Ogata et al. |
| 6,114,674 A | * | 9/2000 | Baugh et al. ............... 219/543 |
| 6,244,716 B1 | | 6/2001 | Steenwyk et al. |
| 6,257,329 B1 | | 7/2001 | Balzano |
| 6,313,653 B1 | * | 11/2001 | Takahashi et al. .......... 324/760 |
| 6,320,128 B1 | | 11/2001 | Glovatsky et al. |
| 6,446,447 B1 | * | 9/2002 | Goth et al. ................. 62/176.1 |
| 6,483,078 B2 | * | 11/2002 | Sullivan ..................... 219/209 |
| 6,621,055 B2 | * | 9/2003 | Weber et al. ............... 219/494 |

* cited by examiner

Primary Examiner—Robin O. Evans
Assistant Examiner—Vinod Patel
(74) Attorney, Agent, or Firm—Quarles & Brady LLP

(57) ABSTRACT

Disclosed is a flexible printed circuit board for use in a control handle. The circuit board includes resistive heating elements for heating electrical components in the circuit to limit the formation of frost and condensation on the components.

18 Claims, 4 Drawing Sheets

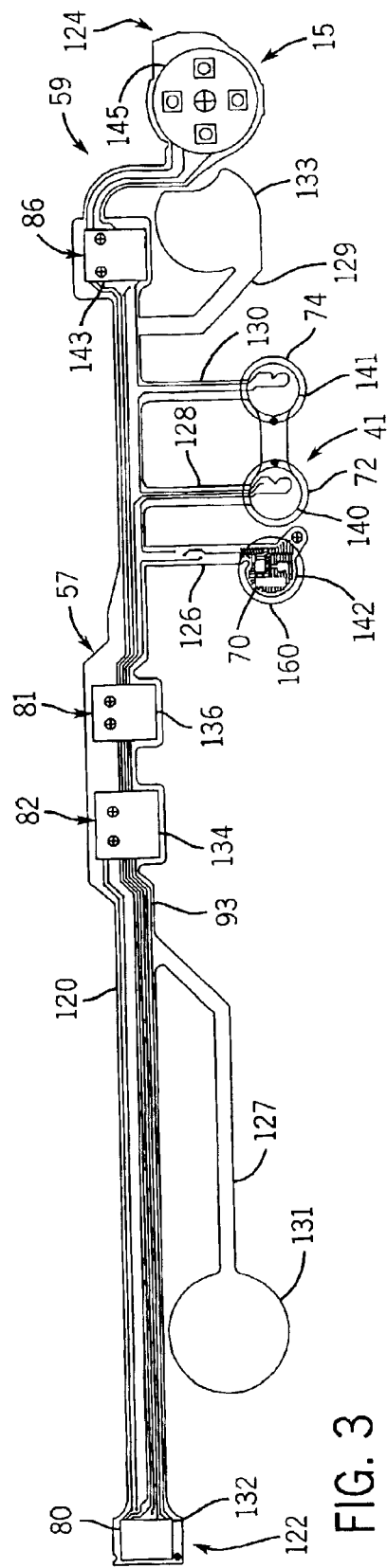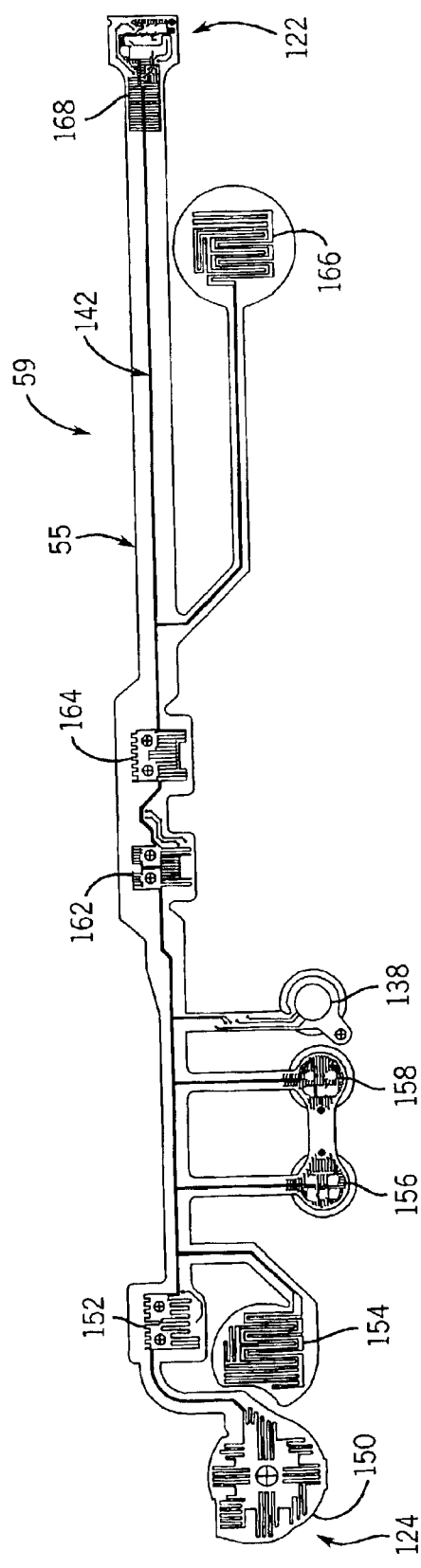

FLEXIBLE HEATER FOR HEATING ELECTRICAL COMPONENTS IN OPERATOR CONTROL HANDLE

BACKGROUND OF INVENTION

The present invention relates to forklift trucks, and in particular, relates to an improved method and apparatus for preventing condensation from accumulating on electrical components and connectors in the control handle of a forklift truck.

There are a number of applications in which fork lifts are used in environments that may precipitate the formation of undesirable moisture. One example is in the storage and retrieval of frozen food items. In these applications, forklift trucks typically move between cold storage, where temperatures can be as low as −25 degrees F., and a warm warehouse environment, in which the temperature can exceed 100 degrees F. Under these operating conditions, the operator controls and operator control handles are subjected to a significant degree of thermal stress, which can result in premature failure. For example, because the temperature of the cold storage application is commonly less than the dew point of the warmer environment, condensation can accumulate on the electrical components in the operator control handle. Subsequently, when the truck travels back into the cold environment, the condensation will freeze on the components, thereby subjecting the components and associated connecting wires to thermal and mechanical stress which can cause corrosion, electrical damage, breakage and failure.

To prevent these problems, heating elements are often provided in operator control handles. These elements are typically discrete resistors wired into the control circuit. Alternatively, heaters provided on flexible heating elements can be provided. These devices, however, typically heat a general area and are therefore not particularly effective in modifying the environment around a specific component. Furthermore, these components and circuits typically have no function other than heating, and therefore may add significant size and complexity to the operator handle without a proportional increase in functionality.

What is therefore needed is a method and apparatus for supplying heat specifically to the components of a control/ circuit or system to limit the accumulation of condensation thereon, and further a method and apparatus for supplying heat to the components of a lift truck electrical system which does not add bulk and complexity to the system, and is also easy to manufacture and assemble.

SUMMARY OF THE INVENTION

In one aspect, the present invention is a circuit board for use in an environment in which varying temperatures can cause condensation, frost, or ice to build up. The circuit board comprises a substrate material having at least one electrical component, and first and second conductive traces mounted thereon. The first conductive trace transmits control signals to and from the electrical component, while the second trace includes a heating element portion sized and dimensioned to provide a resistive heater for heating the electrical component to minimize or prevent condensation, frost, or ice build up.

In another aspect of the invention, a control handle for a lift truck is provided. The control handle comprises a housing including an electrical component activatable by an operator to provide a control function for the lift truck. The control handle includes a circuit board provided on a flexible substrate and sized and dimensioned to be located in the housing. The circuit board includes a first conductor for carrying electrical signals from the electrical component to the lift truck, and a second conductor comprising a resistive heating portion. The resistive heating portion is positioned in the housing in proximity to the electrical component to heat the electrical component to minimize or prevent condensation.

In yet another aspect of the invention, a vehicle is disclosed for use under varying temperature conditions. The vehicle includes a vehicle control system and a temperature sensor, which is electrically coupled to the vehicle control system to provide a control signal indicative of a temperature of operation of the vehicle. The vehicle also includes a control handle having at least one electrical component for providing a control signal to the vehicle control system. The control handle includes a flexible circuit board, including a control signal conductor for conducting electrical signals between the vehicle control system and the electrical component, and a heating conductor provided in the handle in proximity to the electrical component to heat the electrical component. The heating conductor is electrically connected to the vehicle control system, and is selectively activated when the temperature of operation of the vehicle falls below a first predetermined temperature level, and deactivated when the temperature of operation rises above a second predetermined temperature level, such that the temperature of the electrical component is maintained at a level to minimize the formation of condensation and frost.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE DRAWINGS

FIG. 3 is a top view of a flexible circuit incorporating the circuit of FIG. 2.

FIG. 4 is a bottom view of the flexible circuit of FIG. 3;

DESCRIPTION OF THE PREFERRED EMBODIMENTS

Figure 1:
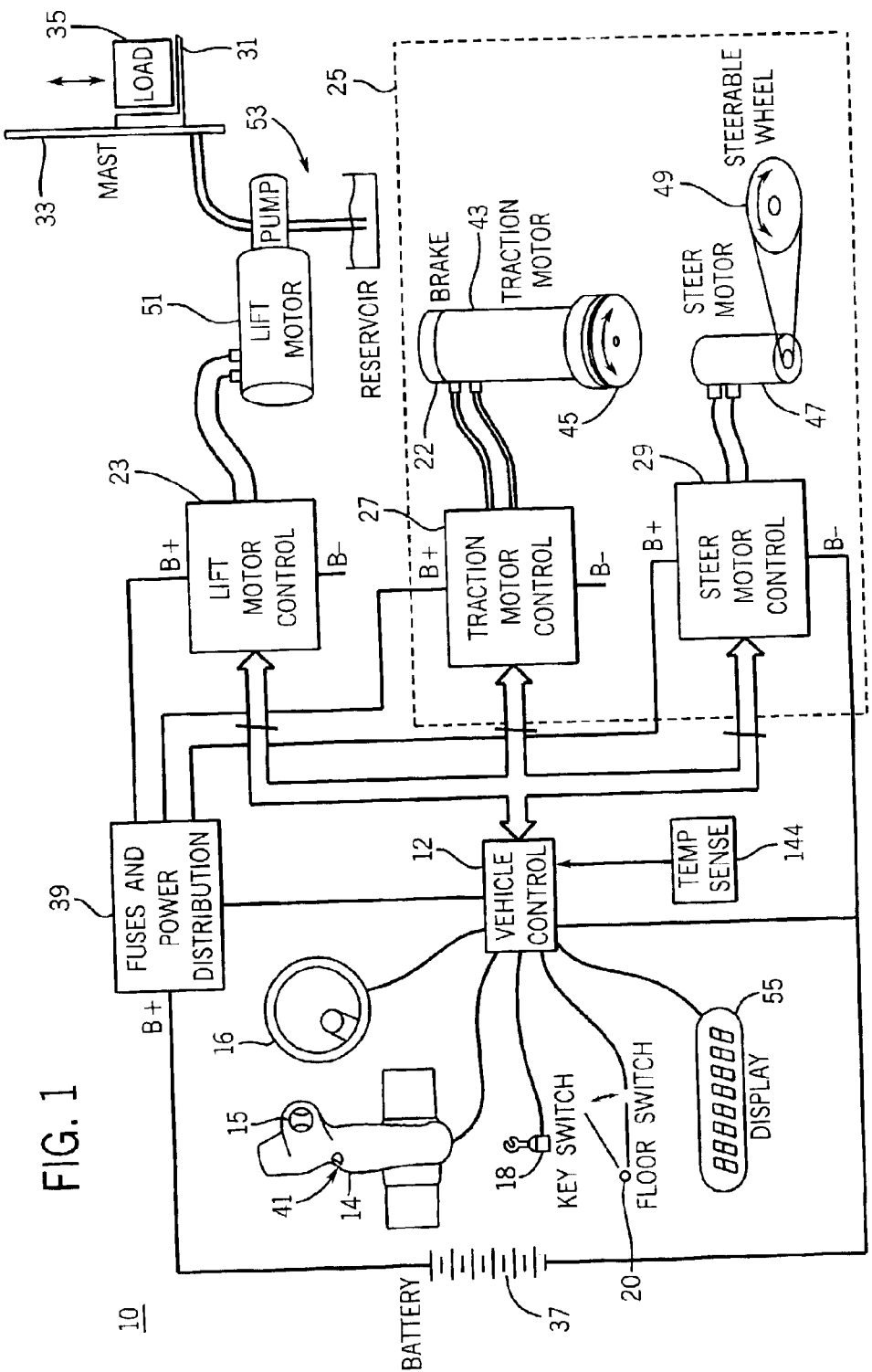
FIG. 1 is a block diagram of a lift truck in which the present invention is incorporated.

Referring now to FIG. 1, a block diagram of a typical lift truck 10 in which the present invention can be used is illustrated. The lift truck 10 comprises a vehicle control system 12 which receives operator input signals from an operator control handle 14, a steer wheel 16, a key switch 18, and a floor switch 20 and, based on the received signals, provides command signals to each of a lift motor control 23 and a drive system 25 including both a traction motor control 27 and a steer motor control 29. The drive system provides a motive force for driving the lift truck 10 in a selected direction, while the lift motor control 23 drives forks 31 along a mast 33 to raise or lower a load 35, as described below. The lift truck 10 and vehicle control system 12 are powered by one or more battery 37, coupled to the vehicle control system 12, drive system 25, and lift motor control 23 through a bank of fuses or circuit breakers 39.

As noted above the operator inputs include a key switch 18, floor switch 20, steering wheel 16, and an operator control handle 14. The key switch 18 is activated to apply power to the vehicle control system 12, thereby enabling the lift truck 10. The floor switch 20 provides a deadman braking device, disabling motion of the vehicle unless the floor switch 20 is activated by the operator, as described below. The operator control handle 14 provides a number of functions. Typically, the handle 14 is rotated in a vertical plane to provide a travel direction and speed command of motion for the lift truck 10. A four-way switch 15 located on the top of the handle 14 provides a tilt up/down function when activated in the forward and reverse directions and a sideshift right and left function when activated to the right and left directions. A plurality of control actuators 41 located on the handle 14 provide a number of additional functions, here including a reach push button 74, a retract push button 72, and a push button 70 for activating a horn as well as a potentiometer 88 (FIG. 6) providing a lift function. A number of other functions could also be provided, depending on the construction and intended use of the lift truck 10.

The traction motor control 27 drives one or more traction motor 43 which is connected to wheel 45 to provide motive force to the lift truck. The speed of the traction motor 43 and associated wheel is selected by the operator from the operator control handle 14, and is typically monitored and controlled through feedback provided by an encoder or other feedback device coupled to the traction motor 43. The wheel 45 is also connected to friction brake 22 through the drive motor, providing both a service and parking brake function for the lift truck 10. The friction brake 22 is typically spring-activated, and defaults to a "brake on" position. The operator must provide a signal indicating that the brake is to be released, here provided by the floor switch 20, as described above. The traction motor 43 is typically an electric motor, and the associated friction brakes 22 can be either electrically operated or hydraulically operated devices. Although one friction brake 22, motor 43, and wheel 45 are shown, the lift truck 10 can include one or more of these elements.

The steer motor control 29 is connected to drive a steer motor 47 and associated steerable wheel 49 in a direction selected by the operator by rotating the steering wheel 16, described above. The direction of the steerable wheel 49 determines the direction of motion of the lift truck.

The lift motor control 33 provides command signals to control a lift motor 51 which is connected to a hydraulic circuit 53 for driving the forks 31 along the mast 33, thereby moving the load 35 up or down, depending on the direction selected at the control handle 14. In some applications, the mast 33 can be a telescoping mast. Here, additional hydraulic circuitry is provided to raise or lower the mast 33 as well as the forks 31.

In addition to providing control signals to the drive system and lift control system, the vehicle control 12 can also provide data to a display 55 for providing information to the operator. Displayed information can include, for example, a weight of a load placed on the forks 31, the speed of the vehicle, the time, or maintenance information.

Figure 2:
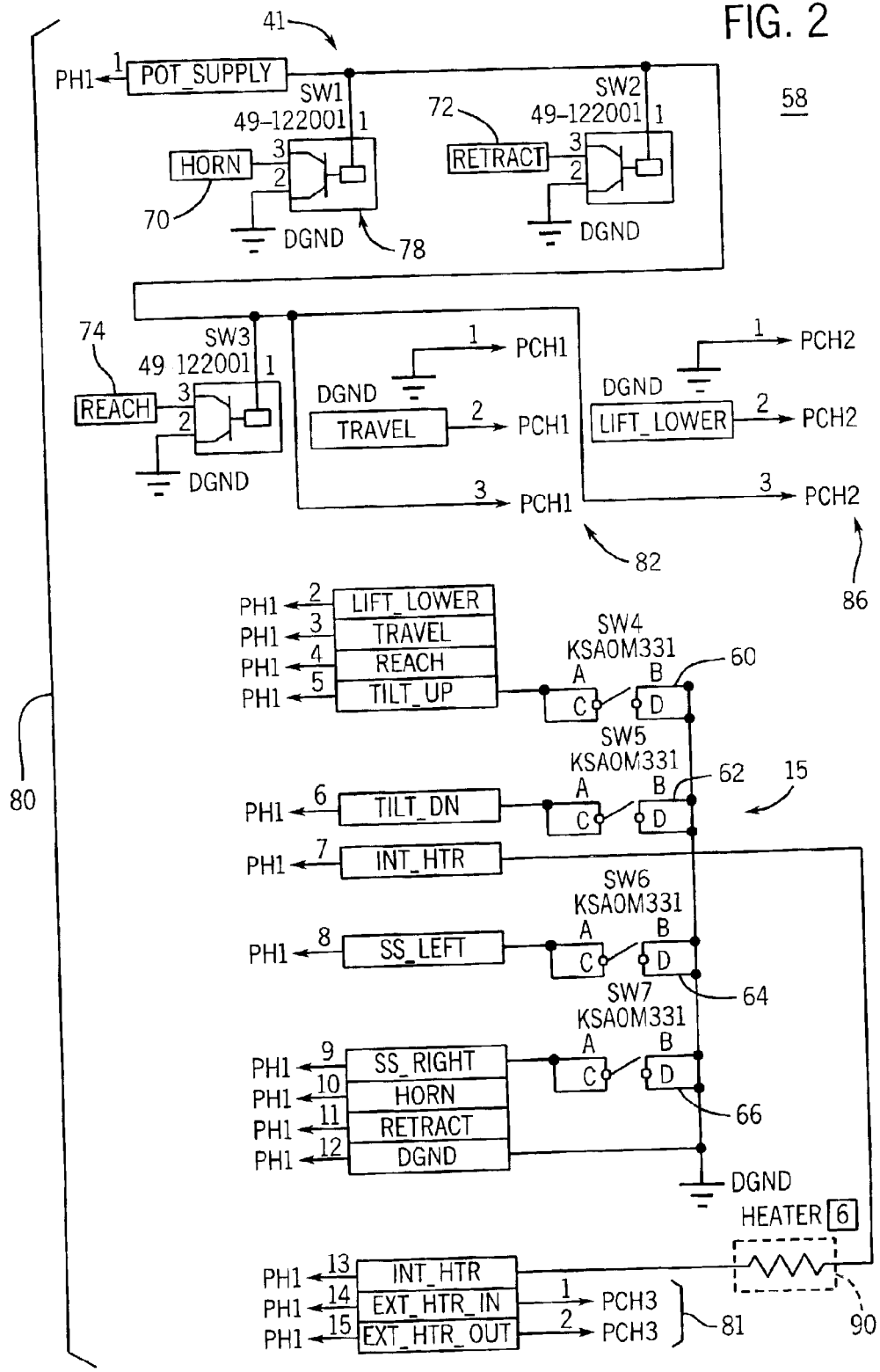
FIG. 2 is a circuit diagram of a printed circuit board provided in the control handle of FIG. 1.
Figure 6:
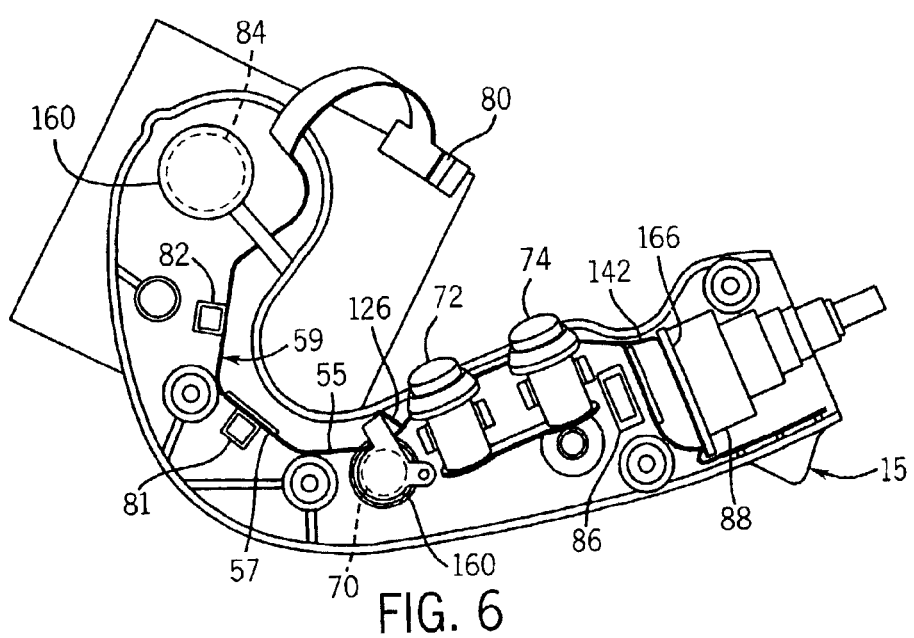
FIG. 6 is a cutaway view of the control handle of FIG. 5.

Referring now to FIG. 2, a circuit diagram of a circuit 58 provided in the control handle 14 is shown. The circuit 58 comprises a connector 80 for electrically connecting controls in the control handle 14 to the control system 12, a connector 82 for electrical connection to a travel potentiometer 84 (FIG. 6), and a connector 86 for electrical connection to a lift potentiometer 88 (FIG. 6). A fourth connector, 81, is provided for connecting an optional heater (not shown), supplied to heat the operator's hand when the lift truck 10 is in use. As noted above, the circuit 58 further comprises a four-way switch 15, the four switches including a tilt up 60, tilt down 62, side shift left 64, and side shift right 66 actuator switch, and control actuators 41 including a horn 70, retract 72, and reach 74 actuator.

Referring still to FIG. 2, the connectors 82 and 86 are each three pin connectors for connection to the potentiometer 84 and 88 (FIG. 6), respectively, in which one pin is connected to ground, a second pin is connected to a potentiometer supply signal provided from the control system 12 through the connector 80, and the third pin connects the potentiometer wiper to the connector 80 to provide a control signal back to the control system 12. The tilt up 60, tilt down 62, side shift left 64, and side shift right 66 actuator switches are each tied to ground at one end and to the connector 80 on the opposing end, wherein activation of any of these switches provides an active low signal to the control system 12 which on receipt of the active low signal, provides the requested function. Each of the horn 70, retract 72, and reach 74 switches comprises a transistor 78, wherein activation of the switch causes an active low signal to be provided on the connector 80, again providing a signal to the control system 12. The circuit 58 further comprises a resistance 90 coupled between two pins of the connector 80 and which is activated to provide heat to the circuit 58 through a signal provided by the control system 12. The resistance 90, although shown as a resistor component in the circuit diagram, comprises resistive material spread along a substrate of the circuit 58 to selectively heat the connectors and components of the circuit, as described below.

Referring now to FIGS. 3 and 4 a front side 57 and a back side 55, respectively, of a flexible circuit board 59 incorporating the circuit 58 (FIG. 2) is shown. The flexible circuit board 59 is a double-sided circuit board constructed of a flexible substrate material such as Kapton® on which conductive material in the form of conductive traces or runs 93 (on the front side 57) and 142 (on the back side) are etched or otherwise attached. The traces 93 and 142 can be constructed, for example of copper, Inconel, and other conductive materials can also be used, as will be apparent to those of skill in the art. A protective layer such as a conformal coating or a second layer of Kapton® is also provided to protect the traces. The flexible circuit board 59 is sized and dimensioned to be inserted into the control handle 14 and to position the connectors and components of the flexible circuit board 59 such that connection with a wiring harness in the lift truck 10 is facilitated and such that the associated control actuators 41 and switch 15 are within easy reach of the operator, based on the handle design. The connector 80, therefore, is provided at a first end 122 of the flexible circuit board 59 for connection to the wiring harness of the lift truck 10, and the four way switch 15 is provided at a second end 124, as this component is provided on the first end of the control handle 14.

The first and second ends 122 and 124, respectively, are connected by a main conductor portion 120 of the flexible circuit board 59, which includes the conductive traces or runs 93 and 142, and which is sized and dimensioned to extend along the length of the control handle 14. The connectors 81, 82, and 86 are provided in the main portion 120, while the switches 70, 72, and 74 are provided on extension portions 126, 128, and 130 of flexible circuit board 59 which extend outwardly and away from the main portion 120. The extension portions 126, 128, and 130 each culminate in an enlarged planar area of substrate material to which the switches 70, 72, and 74 are mounted. The extension portions 126, 128, and 130 of flexible circuit 58 allow the switches 70, 72, and 74 to be moved independently of the main conductive portion 120 and therefore to be positioned in the generally cylindrical control handle 14. The switches 70, 72, and 74 can, for example, be positioned on a side of the control handle 14 within reach of the operator, while electrical communication with the vehicle control system 12 is maintained through conductive traces 93 extending along the extension portions 126, 128, and 130. Additional extension portions 127 and 129 truncate in planar heater portions 131 and 133, which comprise a comparatively larger portion of flexible substrate material on which resistive traces or runs of conductive material are provided to form heating elements, as described below. The heater portions 131 and 133 can also be flexed or formed to be positioned in the control handle 14 to be directed at specific components to be heated, also as described below.

Referring now to FIG. 3, the front side 57 of the flexible circuit board 59 includes stiff mounting plates 132, 134, 136, 140, 141, 143, and 145 comprised of a stiff printed circuit board substrate material. The stiff mounting plates are coupled to the flexible substrate with an adhesive or other coupling device to provide a platform for mounting components such as the actuator controls 41, switch 15, and connectors 80, 81, 82, and 86, which are mounted to the front side 57 of the printed circuit board 59. At least one conductor, run, or trace 93 for transmitting electrical control signals between the components of the flexible circuit board 59 is also provided on the main conductive portion 120 and extension portions 126, 128, and 130 of the front side 57 of the flexible circuit board 59 to provide electrical communications to the components of the circuit 58 as well as to external components, as described with reference to FIG. 2, above. Preferably, all or most of the conductive traces 93 for transmitting control signals are provided on the front side 57 of the flexible circuit board 59, although as necessary, some traces can be extended through through-holes in the flexible circuit board 59 and also extend along the back side 55 of the printed circuit board 59. Although the conductive trace 93 is described as a single trace 93, it will be apparent that the conductive trace 93 can comprise a number of traces, and that the actual number of traces is dependent on the number of electrical components mounted to the flexible circuit board 59, as well as the layout of the board. Furthermore, although the mounting plates are preferably provided in the front side 57 of the printed circuit board 59, in some applications a mounting plate may also be provided on the back side 55 of the printed circuit board 59. Here, for example, a mounting plate 138 (FIG. 4) is provided on the back side 55 of the board, thereby allowing extension 126 to be folded to an opposing side of the control handle 14.

Referring now to FIG. 4, conductive material in the form of at least one conductor, trace, or run 142 is also provided on the back side 55 of the flexible circuit board 59 and is configured to form the resistance 90 for heating the components of the circuit 58. As noted above, the resistance 90 is electrically connected to the connector 80, and receives a control voltage from the control system 12 of the lift truck 10. The resistance 90 includes a plurality of resistive heating elements 150, 152, 154, 156, 158, 162, 164, 166, and 168, each of which is positioned on the substrate to heat a selected electrical component and is sized and dimensioned to provide an appropriate amount of heat for the component. For example, active or passive components which generate heat may require little or no external heating, while mechanical switch components may require a significantly larger degree of heating.

The elements 150, 152, 156, 158, 162, 164, and 168 are positioned on the back side 55 of the flexible substrate aligned with the components of the circuit on the front side 57 of the substrate to selectively heat the components of the control handle 14. The heating elements 154 and 166 are provided on heater portions 131 and 133 on the end of extensions 127 and 129 which are configured in the control handle 14 to heat the off-board travel potentiometer 84 and lift potentiometer 88 (FIG. 6). These potentiometers are provided in the control handle 14 and are connected to the flexible circuit board 59 through the connectors 80, 82, and 86, as described above. A portion of the trace 142 also runs through a through hole to the front side 57 of the board to form the heating element 160.

Referring still to FIG. 4, each of the heating elements 150, 152, 154, 156, 158, 160 (FIG. 3), 162, 164, 166, and 168 comprises a portion of the trace 142 at which the surface area of the conductive material is increased. The increased conductive surface area increases the electrical resistance in the selected portion of the trace 142 to form the respective heating element and therefore to produce directed heat at a selected location. The conductive material of the respective heating element is provided as a portion of the conductive run or trace 142 in which the trace 142 is configured to provide a long path in a relatively short area. Referring, for example, to heating element 154, the trace 142 is configured to include parallel closely spaced traces that double back adjacent to each other to provide the increased length or increased resistance surface area.

The total surface area, thickness, and selected material type of the conductive material determines the total resistance and the amount of heat produced by each heat element. The heat produced at a given heating element can therefore be determined as a ratio of the total amount of conductive material in the respective heating element as compared to the total value of the resistance 90. The amount of conductive material in each respective heating element is chosen to provide approximately equal temperatures at each respective heating element at a given applied voltage. Actual heat produced is therefore determined as a function of the voltage applied to the resistance 90 from the control system 12. Although the back side 55 of the flexible printed circuit board 59 preferably provides the heating function, in some applications, traces carrying control signals may also be provided on the back side 55 of the flexible printed circuit board 59, as noted above. Also as noted above, heating elements can be provided on the front side 57 of the flexible printed circuit board 59, as is shown here with respect to heating element 160.

Figure 5:
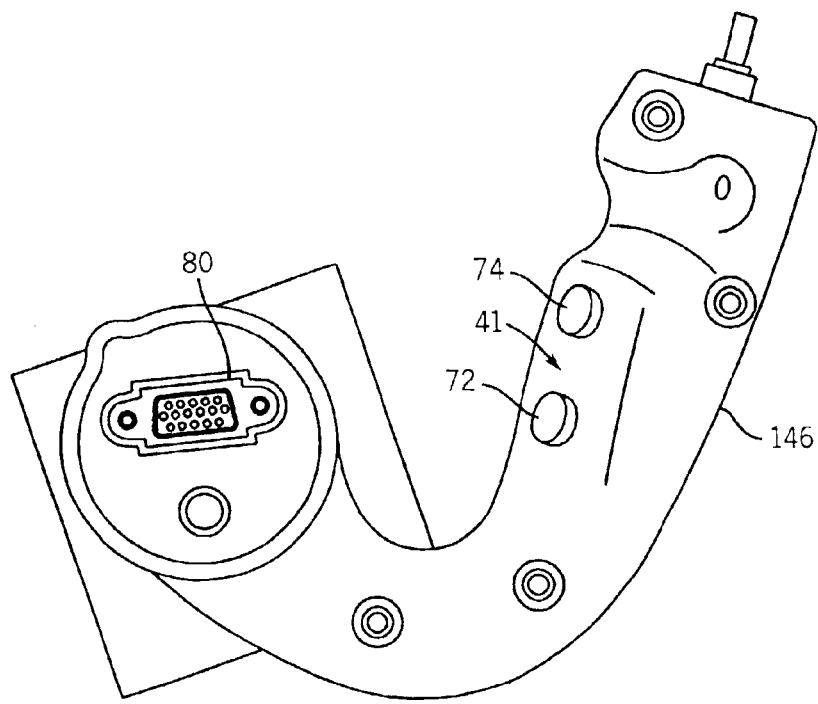
FIG. 5 is a perspective view of the control handle of FIG. 1.

Referring now to FIG. 5, the control handle 14 comprises a housing 146 in which the actuator controls 41, switch 15 (FIG. 6), and connector 80 are mounted. Referring now to FIG. 6, a cross-sectional view of the control handle 14 is shown. The flexible circuit board 59 and associated components, as well as the off-board potentiometers 84 and 88 are mounted within the housing 146. The flexible circuit board 59 runs through the housing 146 of the handle 14, with the top end 124 coupled to the switch 15 and the bottom end 122 to the connector 80. The extensions portions 126, 128, and 130 are flexed to the appropriate locations for mounting the controls 41. As described above, the resistor 90 is preferably provided on the back side 55 of the flexible circuit board 59, with the heating areas aligned with the components of the circuit 58 mounted on the front side 57 of the flexible circuit board 59, such that the heating elements 150, 152, 156, 158, 160, 162, 164, and 168 (FIG. 4) each are aligned with and heat a component 41, 15, 80 81, 82, or 86 mounted on the front side 57 of the flexible printed circuit board 59. Heated areas 154 and 166 provided at the end of the extension portions 127 and 129 are positioned to be aligned with the off-board potentiometers 84 and 88, thereby also providing heat to these components.

The heating elements 150, 152, 154, 156, 158, 160, 162, 164, 166, and 168 are sized and dimensioned to provide sufficient heat to prevent or minimize the formation of condensation and frost on or around the associated component. As an example, in one embodiment, the resistor 90 had a total resistance of 14 ohms, and with an applied voltage of 6.60 volts, produced a total of 3.11 Watts. Wattage associated with each heating element varied from a low of about 0.2 Watts, directed at a relatively small component, to about 0.5 Watts, for the heat element 150 associated with the switch 15. Depending on the applied voltage, the resistance value of the conductive material used the temperature range of use of the lift truck 10 and other features, these numbers can be varied substantially.

Referring again to FIG. 1, in operation, the control system 12 monitors the ambient temperature sensor 144 mounted to the lift truck 10. When the sensed temperature falls below a predetermined value, typically when the temperature is below forty degrees Fahrenheit, the control system 12 applies a voltage across the resistance 90 through the connector 80 to apply heat to the components of the flexible circuit board 59. As described above, the resistance values associated with each of the heated areas are selected to maintain the components of the flexible circuit 58 including the switch 15, actuators 41, potentiometers 88 and 160, and connectors 80, 81, 82, and 86 at a temperature level at which frost is prevented from forming or, in the alternative, is minimized. The heating elements, therefore, are selected to maintain the components at a temperature of thirty-two degrees Fahrenheit or more. In operation, the control system 12 further receives control signals from the components of the flex circuit through the connector 80. The flexible circuit board 59 thereby provides a dual function, providing both a control circuit function and a heating function to the control handle 14.

The resistance 90 can also be activated and deactivated at differing temperatures to provide hysterisis in the heating cycle. For example, to further limit the build up of frost or condensation, the control system 12 can apply a voltage to the resistance 90 at a first selected temperature level, and deactivate the applied voltage only when the ambient temperature rises above a second higher temperature level. For example, the control system can activate the voltage at a temperature of forty degrees Fahrenheit, and deactivate it at fifty degrees Fahrenheit, thereby assuring that the components are continuously warmed whenever they are exposed to cold temperatures. Other temperature variations in which the first temperature level is greater than the second temperature level are also possible.

Although the invention has been described with reference to a flexible printed circuit board, the principles described can also be applied to circuit boards which are not intended to be flexible. Furthermore, although a double-sided board including resistive heating elements mainly on one side is shown and described, these elements can be provided on both sides of the board as required. Alternatively, both the heating and control circuitry could be provided on one side of the board or on a single-sided board. Additionally, the method described could be applied to a multi-layered board. Other variations in the construction of the printed circuit board and lift truck circuitry will be apparent.

Although a number of materials could be used, the flexible circuit board 59 is preferably constructed of Kapton® polyimide film commercially available from E.I. du Pont de Nemours and Company of Circleville, Ohio, and the conductive runs 93 and 142 and associated heating elements are constructed of copper. As noted above, the stiff mounting plates 132, 134, 136, 138, 140, 141, 143, and 145 can be constructed of a printed circuit board substrate material. A second layer of polyimide film is preferably provided over the conductive runs, thereby providing a protective coating and strengthening the circuit.

By providing both a heating and a control signal function in a single flexible circuit, the present invention improves both the performance of the control handle 14 when subjected to varying temperatures and the manufacturability of the control handle 14, simplifying construction and providing greater efficiency in production. The control handle 14 provides a high degree of functionality within a limited space and with a minimum number of parts.

Although the invention has been described with reference to a lift truck, it will be apparent that the invention could be used in any number of vehicles or other equipment which operate in varying temperature increments in which frost and condensation are problematic, as well as to other types of electrical systems subject to varying temperature environments.

It should be understood, therefore, that the methods and apparatuses described above are only exemplary and do not limit the scope of the invention, and that various modifications could be made by those skilled in the art that would fall under the scope of the invention. To apprise the public of the scope of this invention, the following claims are made:

We claim:

1. A control handle for a lift truck, the control handle comprising:
    a housing;
    an electrical component activatable by an actuator to provide a control function for the lift truck;
    a circuit board sized and dimensioned to be located in the housing, the circuit board including:
        a flexible substrate;
        a first conductor provided on the substrate for carrying electrical signals from the electrical component to the lift truck;
        a second conductor comprising a resistive heating portion;
        wherein the resistive heating portion is positioned in the housing in proximity to the electrical component to heat the electrical component.

2. The control handle as defined in claim 1, wherein the electrical component includes an electrical switch.

3. The control handle as defined in claim 1, further comprising a plurality of electrical components and a corresponding plurality of heating element portions, at least one of the heating portions being positioned to heat a corresponding electrical component.

4. The control handle of claim 3, wherein the heating portions are sized to provide an appropriate amount of heat to each component.

5. The control handle as defined in claim 1, further comprising a second electrical component mounted on the flexible substrate, and wherein the second conductor comprises a second resistive heating portion, the second resistive heating portion being positioned in the control handle to heat the second electrical component.

6. The control handle as defined in claim 5, wherein the second electrical component is mounted to a first side of the flexible substrate and the second resistive heating portion is provided on an opposing second side of the flexible substrate.

7. The control handle as defined in claim 1, wherein the electrical component is mounted to the flexible substrate.

8. The control handle as defined in claim 1, wherein the electrical component is mounted in the housing of the control handle and is electrically connected to the printed circuit board.

9. The control handle as defined in claim 1, further comprising an electrical connector mounted on the flexible substrate, the electrical component being electrically connected to the electrical connector.

10. The control handle as defined in claim 1, wherein the resistive heating portion comprises a conductor having a surface area that is sized and dimensioned to provide an increased resistance which produces heat.

11. A vehicle for use in varying temperature conditions, the vehicle comprising:
   a vehicle control system;
   a temperature sensor, the temperature sensor electrically coupled to the vehicle control system to provide a control signal indicative of a temperature of operation of the vehicle;
   a control handle including:
      an electrical component for providing a control signal to the vehicle control system; and
      a flexible circuit board including:
         a control signal conductor for conducting electrical signals between the vehicle control system and the electrical component; and
         a heating conductor provided in the handle in proximity to the electrical component to heat the electrical component, the resistive heating conductor being electrically connected to the vehicle control system;
      wherein, when the temperature of operation of the vehicle falls below a first predetermined temperature level, the vehicle control system activates the heating conductor to heat the electrical component, and when the temperature of operation rises above a second predetermined temperature level, the vehicle control system deactivates the heating conductor.

12. The vehicle as defined in claim 11 wherein the vehicle comprises a lift truck.

13. The vehicle as defined in claim 11 wherein the control handle comprises a plurality of electrical components and a corresponding plurality of heating elements provided in the heating conductor, and wherein each of the heating elements are positioned to heat a corresponding electrical component.

14. The vehicle as defined in claim 11 wherein the electrical component is mounted to the flexible printed circuit board.

15. The vehicle as defined in claim 11, wherein the first predetermined temperature level is less than the second predetermined temperature level.

16. The vehicle as defined in claim 11, wherein the first predetermined temperature level is equivalent top the second predetermined temperature level.

17. The vehicle as defined in claim 11, wherein the first predetermined temperature level is greater than the second predetermined temperature level.

18. The vehicle as defined in claim 13 wherein the electrical components are mounted to the flexible printed circuit board.

* * * * *